United States Patent [19]

Capodieci

[11] Patent Number: 5,717,612
[45] Date of Patent: Feb. 10, 1998

[54] POST-EXPOSURE BAKE SIMULATOR FOR CHEMICALLY AMPLIFIED PHOTORESISTS

[75] Inventor: Luigi Capodieci, Madison, Wis.

[73] Assignee: Advanced Micro Devices, Inc., Sunnyvale, Calif.

[21] Appl. No.: 467,639

[22] Filed: Jun. 6, 1995

[51] Int. Cl.$^6$ .................................................. G06F 9/455
[52] U.S. Cl. ...................... 364/578; 395/500; 364/221.2; 364/232.3; 364/223.4
[58] Field of Search .......................... 395/500; 364/578; 430/30, 300

[56] References Cited

U.S. PATENT DOCUMENTS

| | | | |
|---|---|---|---|
| 5,067,101 | 11/1991 | Kunikiyo et al. | 364/578 |
| 5,282,140 | 1/1994 | Tazawa et al. | 364/468 |
| 5,363,171 | 11/1994 | Mack | 355/68 |

OTHER PUBLICATIONS

Bernard, D.A. "Simulation of PEB effects on Photo. Performance of a Resist Film" *Philips Journal of Research*, vol. 42, No. 5/6, 1987, pp. 566–582.

*Primary Examiner*—Kevin J. Teska

[57] ABSTRACT

A system that simulates the physics of chemically amplified photoresist during bake processing after X-ray or ultraviolet exposure and before development. The simulator implements a physical model including both kinetic reaction between photoacid and tBOC, and photoacid diffusion. The simulator is supplied with initial post-exposure bake parameters, for example, PEB time and temperature, selected for baking a particular photoresist. Data for implementing the physical model at the selected PEB time and temperature are established experimentally and supplied to the PEB simulator to determine the photoacid concentration in the photoresist. The tBOC concentration is calculated using the value of the photoacid concentration.

22 Claims, 2 Drawing Sheets

POST-EXPOSURE BAKE SIMULATOR FOR CHEMICALLY AMPLIFIED PHOTORESISTS

TECHNICAL FIELD

The present invention relates to the fabrication of integrated circuits (IC), and more particularly, to a system that simulates bake of positive chemically amplified photoresists after exposure and before development.

BACKGROUND ART

IC fabrication steps can be grouped into four general types of processes: 1) starting-material processes, which produce the polished silicon wafer; 2) imaging processes, which replicate the IC pattern geometry on the various wafer surfaces; 3) deposition and growth processes, wherein various layers of semiconductor materials are applied to the wafer; and 4) etching-masking operations, in which selective removal or addition of the deposited or grown layers is effected. The result of these processes is the transformation of a thin cross section of a silicon ingot into many integrated circuits containing hundreds of thousands of individual circuit elements.

Once the wafers have been properly prepared, they are coated by photoresists. Spin coating is the most widely used technique for applying the photoresist. The resist is dispensed onto the surfaces of the wafers, which are then accelerated on the coater to provide a thin uniform film across every wafer surface. After coating, the wafers are pre-baked to make the photoresist solid and stable. Then, the pre-baked wafers are transported to an exposure station to transmit a latent image of a desired pattern into the resist film, using a photomask either in proximity or projected onto the resist. Ultraviolet light, X-rays or electron beams can be used to illuminate the wafers during exposure. In the case of electron beam, no mask is used, but rather an electronic pattern. In all cases, the result is a latent image closely matching the pattern of the photomask. In response to the illumination, a positive photoresist leaves behind an image that matches the image of the mask used to expose the resist, whereas a negative photoresist leaves behind an image that is the reverse of the mask. Then, a developer is sprayed or washed over the exposed resist coating to remove exposed positive photoresist or unexposed negative photoresist.

The explosion of microelectronics has brought with it the need for photoresist materials that would provide the increased density in IC geometries. Chemically amplified photoresists, for example the APEX series resist produced by Shipley Company, allows images smaller than 0.5 μm to be provided on the silicon wafer. After the exposure process, the chemically amplified photoresists are baked. As a result of the post-exposure baking, the exposed portions of the positive photoresist become soluble and can be readily washed away by the developer.

More specifically, during the exposure, molecules of photoacid are formed inside the exposed portions of the positive resist to make the resist base-soluble and readily dissolved after the subsequent baking procedure. The photoacid concentration determines the differential solubility of the resist that can be defined as the difference between the dissolution rates of the exposed and unexposed resist areas. Also, as a result of the exposure, submolecules of tert-butoxycarbonyl (tBOC) are uniformly distributed among the exposed and unexposed portions of the resist. When the heat is applied during the post-exposure baking, two types of reactions take place in the positive chemically amplified resist. The first is a kinetic reaction between the photoacid and the tBOC. This reaction often described as the tBOC deprotection, weakens the tBOC molecular structures and renders the tBOC in the exposed areas highly soluble. The second reaction is the thermally driven photoacid diffusion that depends on the photoacid concentration variations in various photoresist areas. As the photoacid concentration variations are determined by the pattern formed on the wafer, the photoacid diffusion is the pattern-dependent process.

The kinetic reaction, as well as the photoacid diffusion are determined by such post-exposure bake parameters as baking temperature and time. However, to properly select these baking parameters for a particular type of the positive chemically amplified photoresist, the kinetic reaction and diffusion must be considered simultaneously because they influence each other. In particular, as discussed above, the kinetic reaction occurs between the tBOC and photoacid. However, due to the photoacid diffusion, the amount of the photoacid available for the kinetic reaction changes during the reaction.

Accordingly, it would be desirable to provide a post-exposure bake (PEB) simulator that would consider the kinetic reaction and the photoacid diffusion at the same time, in order to optimize PEB parameters to obtain a desired pattern for a selected chemically amplified photoresist.

Moreover, such parameters of the formed photoresist pattern as the line width are very sensitive to changes in PEB time and temperature. Therefore, if the PEB parameters are fixed by a particular industrial process, it would be desirable to simulate the post-exposure baking to determine the resultant pattern parameters and their dependency on the PEB time and temperature.

Also, if physical, chemical and functional properties of a particular photoresist are unknown, it would be desirable to simulate the post-exposure bake of the photoresist to determine its properties based, for example, on the line width measured after the post-exposure baking.

DISCLOSURE OF THE INVENTION

Accordingly, one advantage of the present invention is in providing a PEB simulator that considers the kinetic reaction and the photoacid diffusion at the same time, in order to optimize PEB parameters to obtain a desired pattern for a selected chemically amplified photoresist.

Another advantage of the present invention is in providing a PEB simulator for determining the resultant pattern parameters and their dependency on the PEB time and temperature.

Another advantage of the present invention is in providing a PEB simulator for studying photoresist properties based on the photoresist pattern obtained after the post-exposure baking.

The above and other advantages of the invention are achieved, at least, in part, by providing method of and system for simulating a post-exposure bake (PEB) that implement a physical model defining both photoacid diffusion and photoacid loss due to kinetic reaction. The PEB simulator is supplied with initial PEB parameters, for example, PEB time and temperature, selected for baking a particular photoresist. Data for implementing the physical model at the selected PEB time and temperature are established experimentally and supplied to the PEB simulator to determine the photoacid concentration in the photoresist. The tBOC concentration is calculated using the value of the photoacid concentration.

In accordance with one aspect of the invention, the PEB time is divided into a plurality of time intervals. The photoacid concentration is determined for each of the time intervals using space differentiation carried out at the middle and at the end of the time intervals. The calculated value of the photoacid concentration is used to determine tBOC concentration.

In accordance with another aspect of the invention, the spatial derivative of the photoacid concentration with respect to an X direction is determined at the middle of the time interval, whereas the spatial derivative with respect to a Z direction is determined at the end of the time interval.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

Best Mode for Carrying out the Invention

Although the invention has general applicability in the field of lithographyprocess modelling, the best mode for practicing invention is based in part on realization that the post-exposure bake (PEB) simulator provides modelling the physics of positive chemically amplified photoresists during bake processing after X-ray or deep ultraviolet exposure. The PEB simulator has been integrated in the CXrL ToolSet TM software system for X-ray lithography process modelling, however it may be implemented as a stand alone system for PEB simulating.

As discussed above, the PEB procedure involves the kinetic reaction between photoacid and tBOC, and the photoacid diffusion. These two phenomena can be represented by a system of partial differential equations as follows:

$$\frac{\partial B}{\partial L} = -KdBH \quad (1)$$

$$\frac{\partial H}{\partial t} = -Ka(H)^m + D\nabla^2 H \quad (2)$$

where $B \equiv B(t,x,y,z)$ is the protected tBOC concentration of the photoresist, which is a function of time and space, $H \equiv H(t,x,y,z)$ is the photoacid concentration of the photoresist, which is a function of time and space, Ka is a photoacid loss constant that describes the loss of photoacid during the reaction with the tBOC, Kd is a deprotection constant that shows the rate at which the tBOC is deprotected during the kinetic reaction, m is a power that represents the photoacid loss as a function of the photoacid concentration H, D is a diffusion coefficient that describes the photoacid diffusion, $\nabla^2 H$ is a Laplacian that defines the second partial derivative of H, x,y,z determine coordinates of various points within the photoresist, and t is time.

As shown in equation (1), evolution of the tBOC concentration B in time defined by the partial time derivative of B is determined by the tBOC and photoacid concentrations, and by the rate at which the tBOC is deprotected during the kinetic reaction. The minus sign before the deprotection constant indicates that the tBOC deprotection process tends to reduce the tBOC concentration with time.

Referring to equation (2), evolution of the photoacid concentration H in time defined by the partial time derivative of H is determined by both the kinetic reaction and diffusion. The first term of the equation represents the photoacid loss during the kinetic reaction that is defined by the photoacid concentration H to the power m, and on the photoacid loss constant Ka. The minus sign before Ka indicates that the photoacid loss tends to reduce the photoacid concentration with time. The second term of equation (2) representing the photoacid diffusion includes the diffusion coefficient and the Laplacian defined by the second partial derivative of H with respect to space. The Laplacian represents variations of the photoacid concentration in space and can be defined as follows:

$$\nabla^2 H = \frac{\partial^2 H}{\partial x^2} + \frac{\partial^2 H}{\partial z^2} \quad (3)$$

Figure 1:
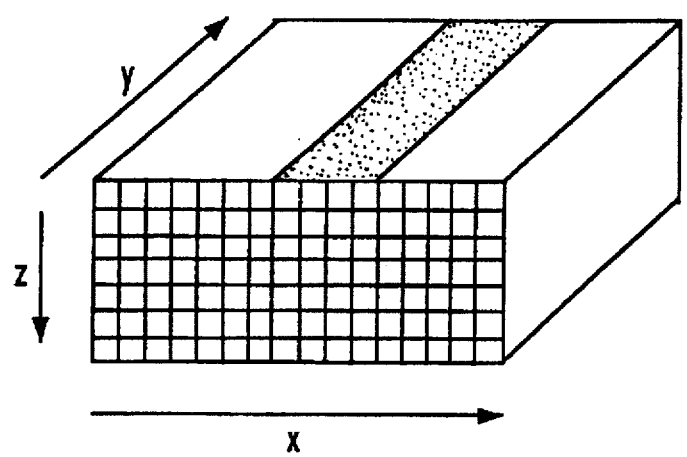
FIG. 1 is an illustrative diagram of a photoresist in a three-dimensional cartesian coordinate system.

An illustrative diagram of a baked photoresist with the pattern to be formed is shown in FIG. 1 in a coordinate system XYZ. The dark area drawn in the Y-direction on the top surface of the resist represents the area covered by a mask during the exposure.

The second term of equation (2) provided with the plus sign indicates that the diffusion tends to increase the photoacid concentration H in areas of low concentration and acts in the direction opposite to the photoacid loss process.

Figure 2:
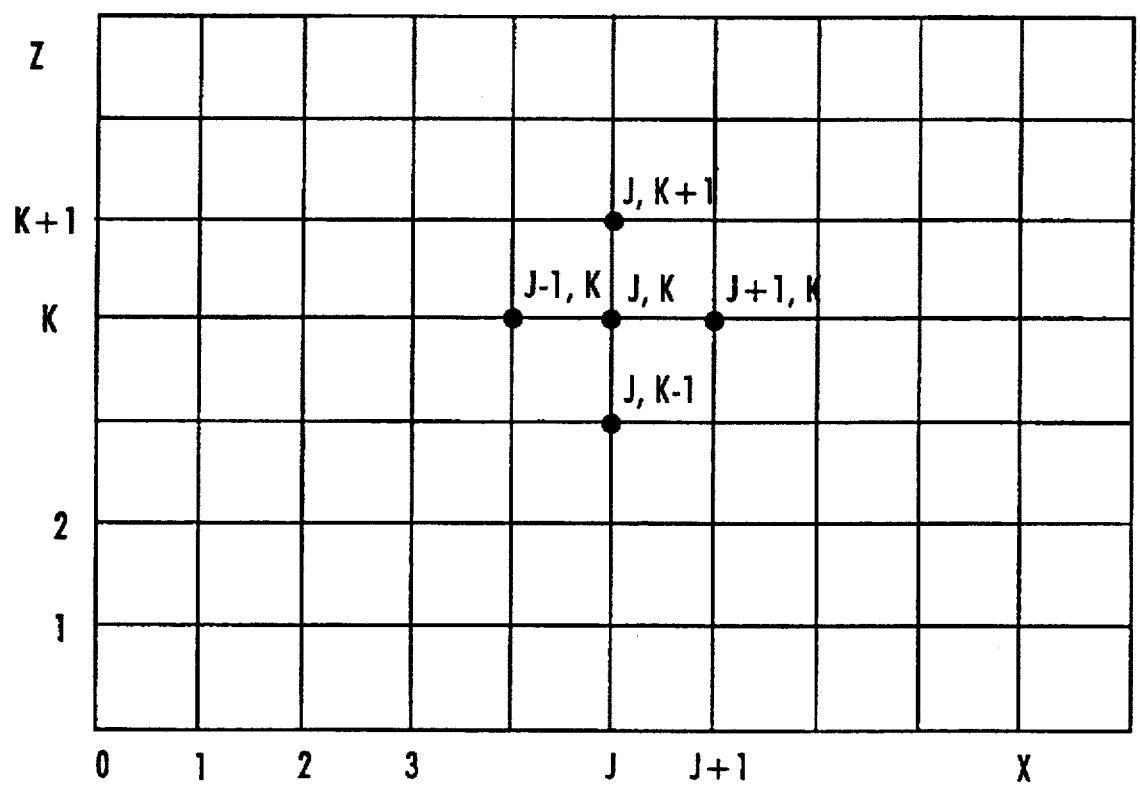
FIG. 2 shows a grid structure on the X-Z plane depicted in FIG. 1.

Using a variation of the Crank-Nickolson method called the Alternating Direction Implicit and Explicit Method found, e.g., in W.H. Press et al., Numerical Recipes in C, Cambridge University Press, the time derivative of E defined in equation (2) can be approximated as follows:

$$\frac{\partial H}{\partial t} = \frac{H_{j,k}^{n+1} - H_{j,k}^n}{\Delta t} \quad (4)$$

wherein as shown in FIG. 2, j and k are coordinates of a grid point on an X-Z plane of the baked photoresist depicted in FIG. 1, n defines a time step within the PEB time, and $\Delta t$ is a time interval between n and n+1.

Accordingly, the time derivative of the photoacid concentration H can be defined as the difference between the values of H at a grid point (j,k) at times (n+1) and n divided by the time interval between (n+1) and n. Therefore, equations (2) and (4) allow the photoacid concentration H to be determined. Then, the calculated value of the photoacid concentration can be used to determine the tBOC concentration B from equation (1).

Figure 3:
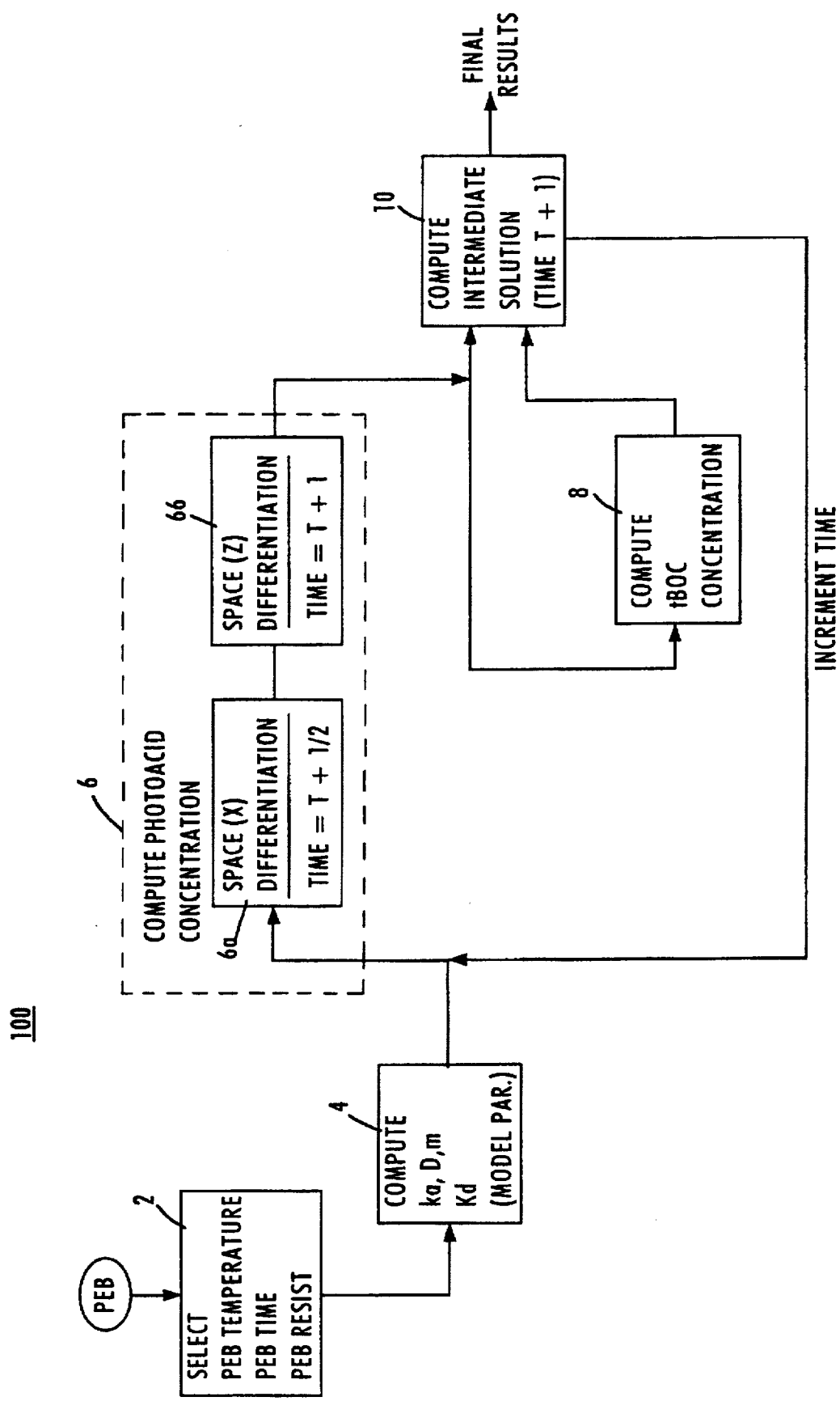
FIG. 3 is a diagram illustrating PEB simulation.

Referring to FIG. 3, the PEB simulating procedure is initiated by supplying a PEB simulator 100 with the initial PEB temperature and time selected for PEB processing of a particular positive chemically amplified photoresist (step 2). Also, the simulator 100 is provided with data indicating the type of the photoresist.

In step 4, values of Ka, Kd, D and m from equations (1) and (2) are determined for the selected PEB temperature, time and type of resist. These values may be retrieved from tables created experimentally, or may be computed based on experimental data. Then, the PEB time is divided into a plurality of time intervals Δt.

In step 6, the value of the photoacid concentration H for the first time interval is determined. To calculate this value, the time interval Δt is divided into two subintervals. Then, space differentiation of H with respect to X-axis is carried out at the middle of the time interval Δt at time (T+½) (step 6a). Space differentiation of H with respect to Z-axis is carried out at the end of the time interval Δt at time (T+1) (step 6b). An XYZ coordinate system used for the space differentiation is shown in FIG. 1. The X-direction is selected to define the width of a line on the formed pattern. The Z-direction defines the depth of the baked photoresist. It is assumed that no concentration variations occur along the line drawn in the Y-direction.

The spatial derivatives of H with respect to X (step 6a) are computed for all grid points (j, k) in the two-dimensional grid shown in FIG. 2 using points (j−1, k) and (j+1, k) in the X direction. The spatial derivatives of H with respect to Z (step 6b) are determined for all grid points (j, k) shown in FIG. 2 using points (j, k−1) and (j, k+1) in the Z direction. Accordingly, the same central point (j, k) is considered for both operations at times (T+½) and (T+1). For example, a 1024 points+50 points grid structure may be used.

Accordingly, the photoacid concentration variations along the X direction are determined at the middle of the first time interval, and the photoacid concentration variations along the Z direction are determined at the end of the first time interval. Using a variation of the Alternating Direction Implicit and Explicit Method, the photoacid concentration H defining photoacid distribution within the photoresist can be calculated for time (T+1) based on equations (2) and (4).

Then, in step 8, using equation (1) the distribution of the tBOC concentration B is determined for time (T+1) based on the value of H for time (T+1). In step 10, the PEB simulator 100 provides an intermediate result for the first time interval, based on the photoacid and tBOC concentrations at time (T+1).

Then, a time increment is performed to compute the photoacid and tBOC concentrations for the next time interval. This procedure is similar to the above discussed procedure for the first time interval. The photoacid and tBOC concentrations determined for the last time interval within the PEB time are provided at the output of the PEB simulator as a final result of the PEB processing. The final photoacid and tBOC concentrations allows to establish parameters of a pattern formed on the selected photoresist at the selected PEB temperature for the selected PEB time. For example, it can be determined that a portion of the resist having the final tBOC concentration lower than a preset level, will be washed away during the development. Therefore, the final tBOC concentration determines such photoresist pattern parameters as the line width. Also, the final tBOC concentration may be converted into a dissolution rate of the photoresist.

There accordingly has been described a PEB simulator that provides conversion of such PEB parameters as temperature and time into photoacid and tBOC concentrations of a selected chemically amplified photoresist baked after exposure and before development. This conversion takes into account the interaction between the kinetic reaction of the photoacid and tBOC, and the photoacid diffusion during the PEB procedure. Therefore, the PEB simulator allows the PEB temperature and time to be controlled in accordance with desired parameters of a photoresist pattern.

Also, as the PEB simulator indicates the dynamics of the photoacid and tBOC concentrations, it allows physical, chemical and functional properties of a particular chemically amplified photoresist to be determined.

In this disclosure, there are shown and described only the preferred embodiments of the invention, but it is to be understood that the invention is capable of changes and modifications within the scope of the inventive concept as expressed herein.

I claim:

1. A method of simulating a post-exposure bake (PEB) for a chemically amplified photoresist having photoacid and tBOC components comprising the steps of:
   (a) supplying a PEB simulator with initial PEB parameters selected for baking said photoresist,
   (b) supplying the PEB simulator with data defining a kinetic reaction and a diffusion in said photoresist during the PEB at said initial PEB parameters,
   (c) determining photoacid variations in a space occupied by said photoresist based on said data to calculate the photoacid concentration of the photoresist, and
   (d) determining tBOC concentration of the photoresist based on the calculated photoacid concentration.

2. The method of claim 1 further comprising the step of adjusting said initial PEB parameters based on the photoacid and tBOC concentrations.

3. The method of claim 1, wherein said PEB is divided into a plurality of time intervals and said steps (c) and (d) are carried out for each of said time intervals.

4. The method of claim 3, wherein said step (c) comprises the step (c1) of determining concentration variations along a first direction corresponding to the width of a line to be formed on said photoresist.

5. The method of claim 4, wherein said step (c) further comprises the step (c2) of determining concentration variations along a second direction perpendicular to said first direction.

6. The method of claim 5, wherein said step (c1) is carried out at the middle of each of said time intervals.

7. The method of claim 6, wherein said step (c2) is carried out at the end of each of said time intervals.

8. The method of claim 1, wherein said initial PEB parameters comprises temperature of the PEB procedure.

9. The method of claim 1, wherein said initial PEB parameters comprises time of the PEB procedure.

10. The method of claim 1, wherein interaction between said kinetic reaction and said diffusion is considered to determine said photoacid concentration.

11. Apparatus for simulating a PEB for a photoresist comprising:
   first means for selecting initial PEB parameters,
   second means responsive to said first means for determining data relating to processes in said photoresist during the PEB at said selected PEB parameters,
   third means responsive to said second means for performing space differentiation of concentration of a first component of said photoresist to determine distribution of the first component, and
   fourth means responsive to said third means for calculating distribution of a second component of said photoresist based on the distribution of the second component.

12. The apparatus of claim 11, wherein said first component comprises photoacid.

13. The apparatus of claim 12, wherein said second component comprises tBOC.

14. The apparatus of claim 11, wherein said initial PEB parameters comprises temperature.

15. The apparatus of claim 11, wherein said initial PEB parameters comprises time.

16. The apparatus of claim 11, wherein said space differentiation means comprises means for differentiation in a first direction corresponding to width of a line to be formed on said photoresist.

17. The apparatus of claim 16, wherein said space differentiating means further comprises means for differentiation in a second direction perpendicular to said first direction.

18. The apparatus of claim 17, wherein said PEB is divided into a plurality of time intervals and said space differentiation is performed for each of said time intervals.

19. The apparatus of claim 18, wherein said differentiation in the first direction is performed at the middle of each of said time intervals.

20. The apparatus of claim 19, wherein said differentiation in the second direction is performed at the end of each of said time intervals.

21. A method of simulating a post-exposure bake (PEB) for a chemically amplified photoresist having photoacid and tBOC components comprising the steps of:

(a) supplying a PEB simulator with initial PEB parameters selected for baking said photoresist, (b) supplying the PEB simulator with data defining a kinetic reaction and a diffusion in said photoresist during the PEB at said initial PEB parameters, (c) determining photoacid variations in a space occupied by said photoresist based on said data to calculate the photoacid concentration of the photoresist, using calculating concentration variations along a direction corresponding to the width of a line to be formed on said photoresist, and (d) determining tBOC concentration of the photoresist based on the calculated photoacid concentration.

22. Apparatus for simulating a PEB for a photoresist comprising:

first means for selecting initial PEB parameters, second means responsive to said first means for determining data relating to processes in said photoresist during the PEB at said selected PEB parameters, third means responsive to said second means for performing space differentiation of concentration of a first component of said photoresist to determine distribution of the first component, including means for differentiation in a direction corresponding to the width of a line to be formed on said photoresist, and fourth means responsive to said third means for calculating distribution of a second component of said photoresist based on the distribution of the second component.

* * * * *